United States Patent [19]

Zhang

[11] Patent Number: 4,750,081
[45] Date of Patent: Jun. 7, 1988

[54] PHANTOM ESD PROTECTION CIRCUIT EMPLOYING E-FIELD CROWDING

[75] Inventor: Xiaonan Zhang, San Diego, Calif.
[73] Assignee: Unisys Corporation, Detroit, Mich.
[21] Appl. No.: 109,942
[22] Filed: Oct. 19, 1987
[51] Int. Cl.$^4$ .............................................. H05F 3/00
[52] U.S. Cl. .................................... 361/220; 361/91; 357/23.13
[58] Field of Search ............... 361/212, 220, 91, 56, 361/111; 250/390; 357/23.13

[56] References Cited

U.S. PATENT DOCUMENTS

| | | | |
|---|---|---|---|
| 4,106,048 | 8/1978 | Khajezadeh | 361/91 X |
| 4,481,421 | 11/1984 | Young et al. | 250/390 |
| 4,605,980 | 8/1986 | Hartranft et al. | 357/23.13 |
| 4,686,602 | 8/1987 | Bucksch | 361/91 |
| 4,692,781 | 9/1987 | Roundtree et al. | 357/23.13 |

Primary Examiner—L. T. Hix
Assistant Examiner—Brian W. Brown
Attorney, Agent, or Firm—Charles J. Fassbender; L. Joseph Marhoefer

[57] ABSTRACT

An integrated circuit chip having improved static discharge protection comprises a semiconductor substrate with a major surface, a plurality of transistors that are integrated into the surface, patterned conductors that interconnect the transistors and route input signals to the transistors, with the patterned conductors including metal pads for receiving the input signals from an external source; wherein the improvement comprises respective diodes which are integrated into the surface directly beneath the metal pads, and which connect the pads to the substrate and conduct electrostatic charge therebetween. With this structure, no additional chip space is required over that which is used by the transistors which are being protected since the diodes are hidden in the normally unused chip space beneath the pads. Also with this structure, the diodes can be large since the metal pads are inherently large enough to receive a bonding wire; and thus the diodes have a large current-carrying capacity and a small series resistance. Preferably, the metal pads have sharp corners of 90° or less which tend to accumulate any electrostatic charge, and the diodes are disposed beneath the metal pads at these corners. Since the diodes are located where the charge tends to accumulate, they are more effective in dissipating that charge than if they were located elsewhere.

11 Claims, 5 Drawing Sheets

PHANTOM ESD PROTECTION CIRCUIT EMPLOYING E-FIELD CROWDING

BACKGROUND OF THE INVENTION

This invention relates to electrostatic discharge protection circuits (ESD protection circuits) for integrated circuit chips.

Basically, in an integrated circuit chip, large metal pads are provided on which discrete wires are bonded to thereby provide a means whereby input signals can be sent to and output signals received from the chip. Those signals, under normal operating conditions, are restricted to lie within a certain voltage range. Typically, that voltage range is ±5 volts, or even smaller. However, due to electrostatic charge, the voltage on the pads can, for a short time period (e.g., a few nanoseconds), become 1,000 volts or higher.

Such electrostatic charge first accumulates on one's body. A simple circuit, which approximates the equivalent circuit for the human body, is a 100 picofarad capacitor in series with a 1,500 ohm resistor. By accumulating a charge of just $1 \times 10^{-7}$ Coulomb's of charge on this capacitor, the voltage across it becomes 1,000 volts. This amount of charge, either positive or negative, can readily be accumulated on the human body. Thereafter the charge will be transferred to a pad when the person contacts either the pad, or a wire to which the pad is connected, with a probe.

When this charge is transferred to a contact pad on an integrated circuit, a large current can flow onto the chip and there burn out any transistors which are connected to the pads. So to address this problem, various static discharge protection circuits have been proposed in the prior art. See, for example, U.S. Pat. Nos. 4,481,421 and 4,605,980, and 4,686,602. However, the protection circuits of these patents, and others, have serious deficiencies.

One problem is that the previously disclosed protection circuits all occupy at least some chip space which detracts from the space which is available for the remaining circuitry on the chip. Consequently, there is a tendency to reduce the size of the components which make up the input protection circuitry. But that in turn decreases the current-carrying capacity and increases the series resistance of the input protection components. This then presents a real dilemma,—if the components are made too small, they will burn out; and if they are made too large, they will occupy too much chip space. Further, the prior art protection circuitry, as will be shown in detail later, is not located where the electrostatic charge tends to accumulate, and so its effectiveness in removing that charge is reduced.

Accordingly, a primary object of the invention is to provide an improved static discharge protection circuit for integrated circuits in which all of the above problems are overcome.

In accordance with the invention, an integrated circuit chip having improved static discharge protection comprises a semiconductor substrate with a major surface, a plurality of transistors that are integrated into the surface, patterned conductors that interconnect the transistors and route input signals to the transistors, with the patterned conductors including metal pads for receiving the input signals from an external source; wherein the improvement comprises respective diodes which are integrated into the surface directly beneath the metal pads, and which connect the pads to the substrate and conduct electrostatic charge therebetween. With this structure, no additional chip space is required over that which is used by the transistors which are being protected since the diodes are hidden in the normally unused chip space beneath the pads. Also with this structure, the diodes can be large since the metal pads are inherently large enough to receive a bonding wire; and thus the diodes have a large current-carrying capacity and a small series resistance. Preferably, the metal pads have sharp corners of 90° or less which tend to accumulate any electrostatic charge, and the diodes are disposed beneath the metal pads at these corners. Since the diodes are located where the charge tends to accumulate, they are more effective in dissipating that charge than if they were located elsewhere.

BRIEF DESCRIPTION OF THE DRAWINGS

Various preferred embodiments of the invention are described herein in detail in conjunction with the accompanying drawings wherein.

DETAILED DESCRIPTION OF THE INVENTION

Figure 1:
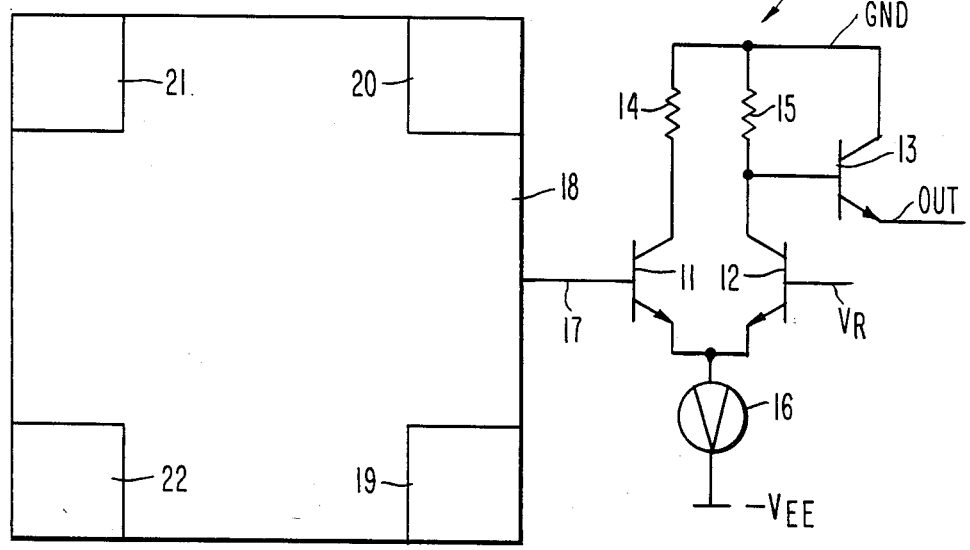
FIG. 1 shows a preferred embodiment of the invention.

Referring now to FIG. 1, a preferred embodiment of the invention will be described in detail. In FIG. 1, reference numeral 10 indicates a logic gate which is comprised of three bipolar transistors 11 thru 13, two resistors 14 and 15, and a current source 16. All of these components 11 thru 16 are integrated into the surface of a single semiconductor chip, and there they are interconnected as shown by patterned conductors. One of those conductors 17 goes from the base of transistor 11 to a rectangular metal bonding pad 18 which also is the chip. Pad 18 provides a contact whereby an input signal from a source external to the chip can be applied to logic gate 10.

Under normal operating conditions, the input signal on pad 18 is restricted to lie within a certain predetermined voltage range such as −0.8 volts and −1.6 volts. When the input signal is at −0.8 volts, current from the current source 16 passes through transistor 11, and so the output voltage of transistor 13 is high. Conversely, when the input signal on pad 18 is at −1.6 volts, current from the current source 16 passes through transistor 12 and so the output voltage of transistor 13 is low.

However, as was explained in the background of the invention, electrostatic charge on the order of $1 \times 10^{-7}$ Coulomb's can be deposited on pad 18 and thereby significantly raise or lower the pad's voltage. That charge, if allowed to pass down conductor 17 through transistor 11, can burn out the transistor. But with the present invention, this problem is mitigated by incorporating four diodes 19–22 directly under the four 90° corners of pad 18. Each of these diodes is comprised of an N+ region which contacts pad 18, and a P+ region which contacts the N+ region and the underlying P− semiconductor substrate.

In operation, when a large negative charge is electrostatically deposited on pad 18, the diodes 19-22 become forward biased and conduct this charge to the substrate. Conversely, when a large positive charge is electrostatically deposited on pad 18, the diodes 19-22 break down and conduct this charge to the substrate. A power supply (not shown) is always used to provide a DC bias voltage to the substrate of an integrated circuit chip, and that supply also removes the electrostatic charge from the substrate.

One important feature of the above structure is that the diodes 19-22 take no additional chip space over that which would otherwise be used if no static discharge protection were provided at all. This is significant because chip space is at premium. Frequently it is desirable to be able to put as many logic gates as possible on a chip, and adding static discharge protection circuitry external to pad 18 hinders that objective since both the protection circuitry and its interconnections to the pad take valuable chip space.

Another important feature of the above structure is that the diodes 19-22 can be made very large since the pad 18 is forced to be large. That pad must be at least as wide as a bonding wire, which always is at least 50 micrometers by 50 micrometers so that it doesn't break. Preferably, each of the diodes 19-22 is at least ten micrometers by ten micrometers (whereas one bipolar transistor is typically only two micrometers by four micrometers). It is important that the diodes 19-22 not be too small since their current-carrying capacity is proportional to their cross-sectional area, and their series resistance is inversely proportional to their cross-sectional area. Diodes which are too small will burn out and/or force current through transistor 11 due to their series resistance.

Figure 2:
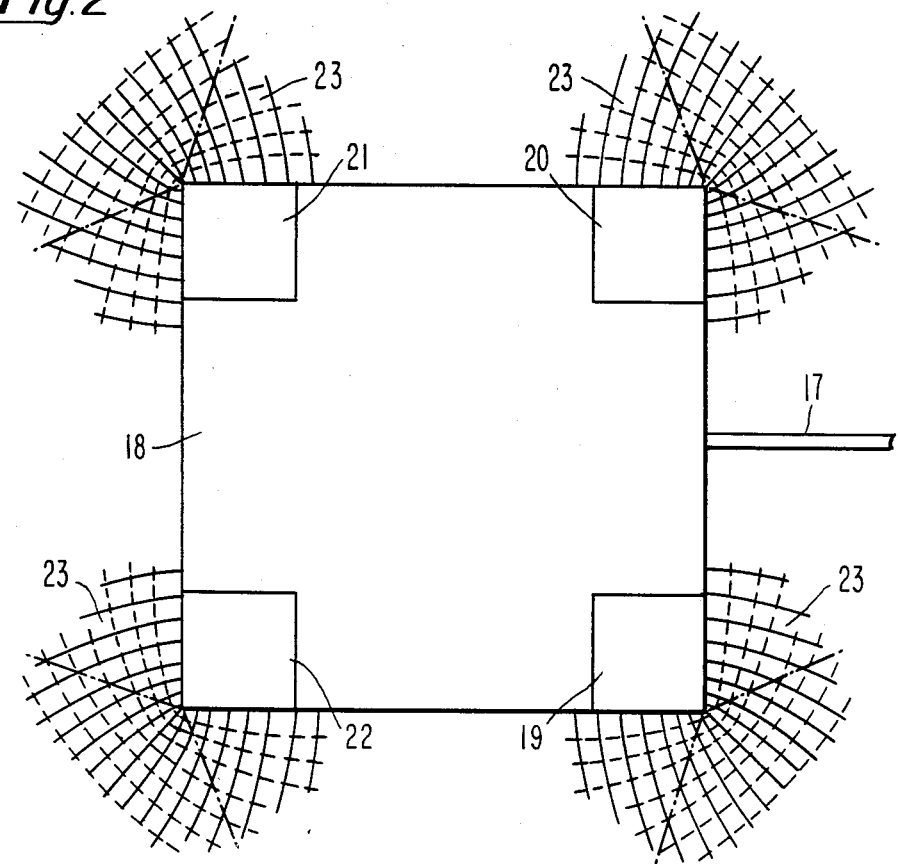
FIG. 2 illustrates how the FIG. 1 embodiment accumulates electrostatic charge in certain regions and there dissipates that charge.

Still another feature of the above described structure is that the diodes 19-22 are located at sharp corners, and that is where electrostatic charge tends to accumulate. That is the principle of the lightning rod. Thus the diodes are more effective in removing the charge than if they were simply located external to pad 18 and attached to conductor 17. This is illustrated in FIG. 2 wherein electric field lines 23 are mapped at the corners of the pad 18. These field lines tend to crowd at the corners, and charge density is inversely proportional to the distance between the field lines.

Figure 3:
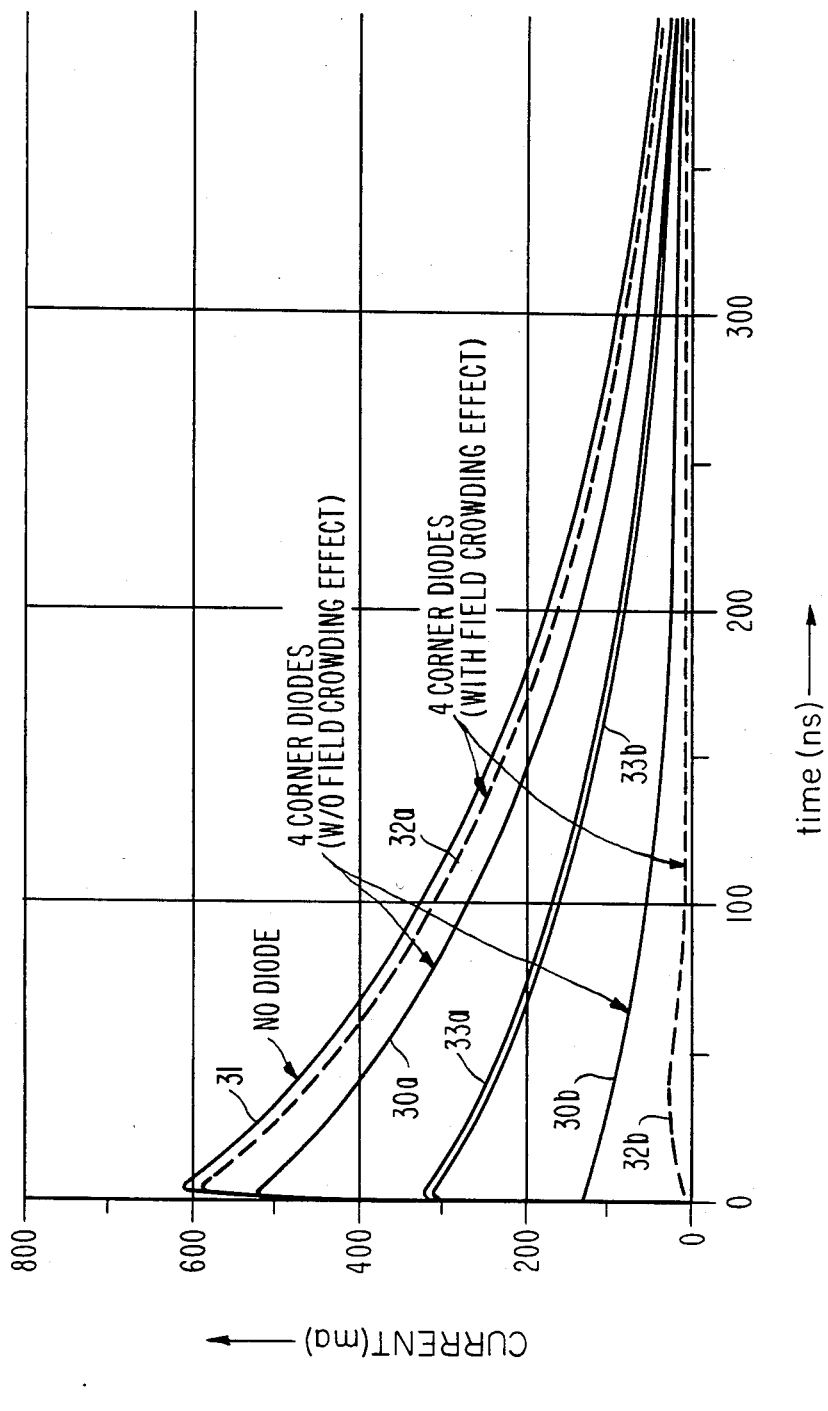
FIG. 3 shows the results of a computer simulation of the operation of the FIG. 1 embodiment.

Turning now to FIG. 3, the results of a computer simulation of the FIG. 1 circuit will be described. To do this simulation, a publicly available computer program called SPICE was used. Resistors 14 and 15 were set at 1K ohms each; current source 16 had a 500 ohm resistance to $V_{EE}$; transistors 11 and 12 each had a 500 ohm parasitic collector-substrate resistance; and the series resistance of each of the four diodes 19-22 was set at 80 ohms; and the parasitic capacitance of pad 18 was 5 picofarad. Also in this simulation, electrostatic charge was deposited on pad 18 through a 1,500 ohm resistor from a 100 picofarad capacitor which was charged to 1,000 volts. (This circuit, as was explained in the Background, simulates the human body.)

In FIG. 3, curve 30a shows the current in milliamps which passes through the four diodes 19-22; whereas curve 30b shows the current which passes into the base of transistor 11. By comparison, curve 31 shows the current which passes through the base of transistor 11 when the diodes 19-22 are eliminated. A comparison of curve 31 with 30b shows that the diodes 19-22 reduce the electrostatic discharge current through transistor 11 by over 70%.

Note that in this simulation, the effect of electric field crowding at the corners of the bonding pad 18 was not even taken into account. When that added factor is accounted for, the current through the diodes 19-22 will increase as shown by curve 32a; and the current into the base of transistor 11 will decrease as shown by curve 32b. Also as curves 32a and 32b show near time zero, the corner diodes conduct charge before it gets to transistor 22 since the diodes are located where the charge accumulates. This in turn lowers the peak current through transistor 11.

Also for comparison purposes, the FIG. 1 circuit was simulated with the diodes 19-22 removed and replaced with a single 80 ohm diode which was located outside of pad 18 and connected to conductor 17. Curve 33a shows the current through the base of transistor 11 which this simulation produced; whereas curve 33b shows the current through the single diode. Here the two currents are about equal, and conduction occurs through the diode and transistor 11 at above the same time since neither one is located where the charge accumulates.

Figure 4A:
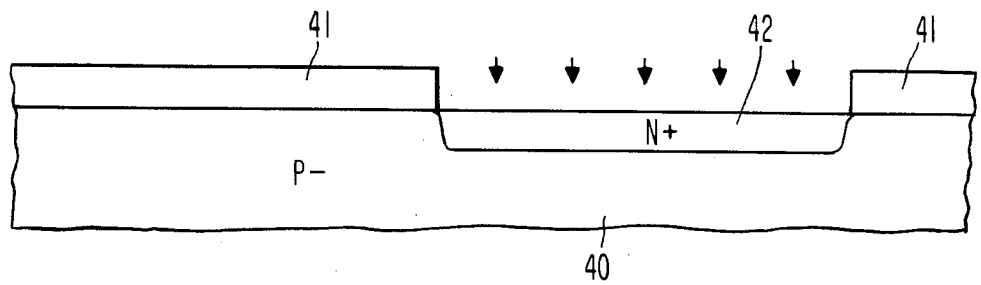
FIGS. 4A–4F are greatly enlarged sectional views which illustrate a process for fabricating the FIG. 1 embodiment.

Next, a preferred process for fabricating the FIG. 1 structure will be described in conjunction with FIGS. 4A-4F. This process begins with a P− substrate 40 on which a mask 41 is disposed which defines the N+ active regions 42 for all of the transistors. All of the regions 42 are doped N+ through mask 41 as indicated in FIG. 4A.

Figure 4B:
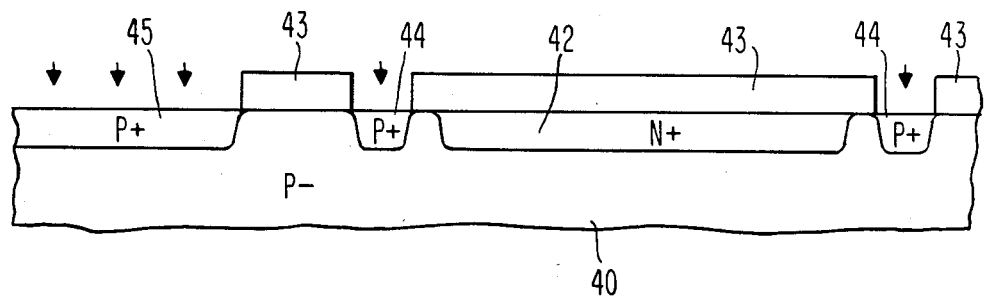

Subsequently, another mask 43 is disposed on substrate 40 which defines both the channel stop regions 44 that isolate the transistor regions 42 from each other, and the P+ regions 45 for all of the diodes 19-22. These regions 44 and 45 are doped P+ through mask 43 as shown in FIG. 4B.

Figure 4C:
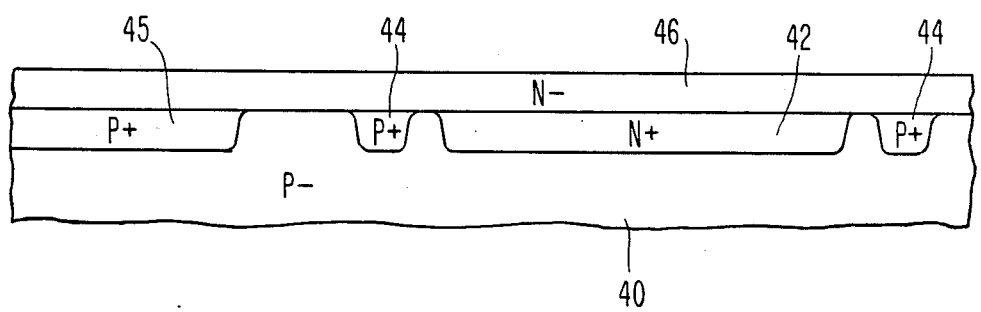
Figure 4D:
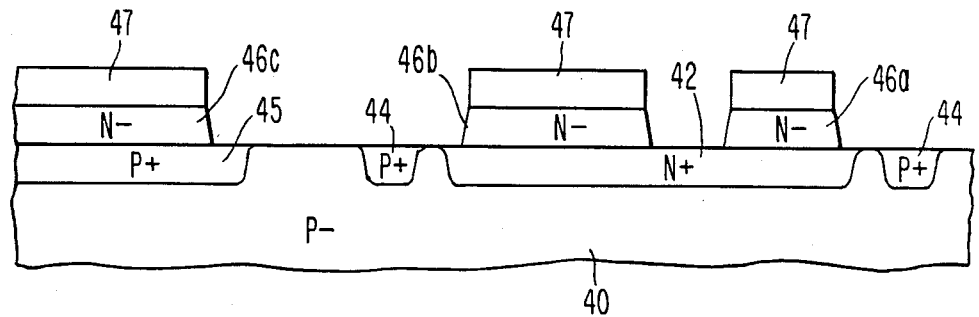

Subsequently, an N− doped epilayer 46 is formed over the entire substrate as shown in FIG. 4C. This epilayer is then patterned by a mask 47 as shown in FIG. 4D such that one portion 46a of the epilayer remains over the collector region of each transistor, another portion 46b remains over the emitter and base region of each transistor, and another portion 46c remains over each of the diodes 19-22.

Figure 4E:
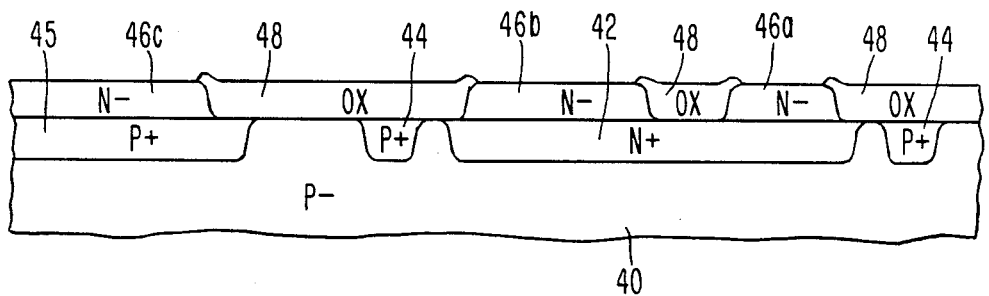
Figure 4F:
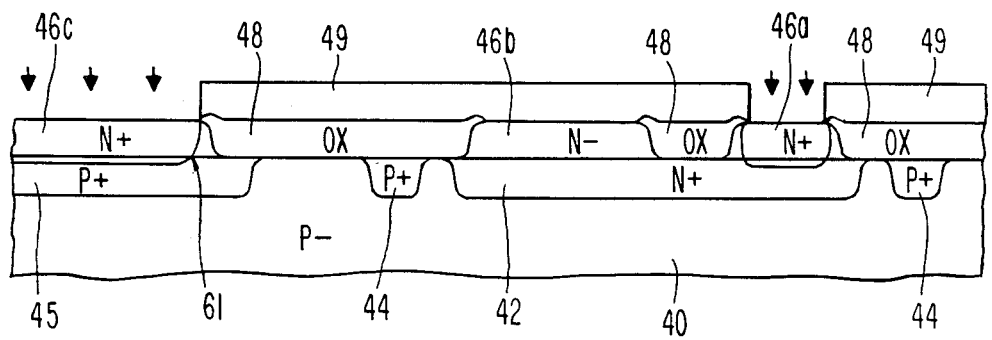

Thereafter, field oxide 48 is grown between the regions 46a, 46b, and 46c; and FIG. 4E shows the result of this step. Subsequently, another mask 49 is disposed on the FIG. 4E structure which exposes just the collector region 46a of each transistor and the diode regions 46c. These regions, as shown in FIG. 4F, are then doped N+.

At this point in the process, all of the diodes 19-22 are completely fabricated. All that remains is to form the transistor's emitter in region 46b, and to form patterned conductors which define each bonding pad 18 and interconnections between the bonding pads and the transistor's base, collector, and emitter.

A significant feature of the above process is that no additional steps have to be performed over those which are required to fabricate the transistor itself. All that is needed is a modification to the masks 43 and 49 such that they define not only the channel stop regions and the collector regions, but also the diodes 19-22.

Still another feature of the above process is that the junctions in the diodes 19-22 inherently are heavily doped. This is because the channel stop regions and collector regions, which are simultaneously formed with the diodes, must be heavily doped to respectively provide good isolation and low resistance. But in the diodes 19–22, the heavy doping produces a low breakdown voltage, since breakdown voltage is inversely proportional to doping concentration. Consequently, the diodes protect the input transistor from both positive and negative charge.

A preferred embodiment of the invention has now been described in detail. In addition, however, many changes and modifications can be made to these details without departing from the nature and spirit of the invention.

Figure 5:
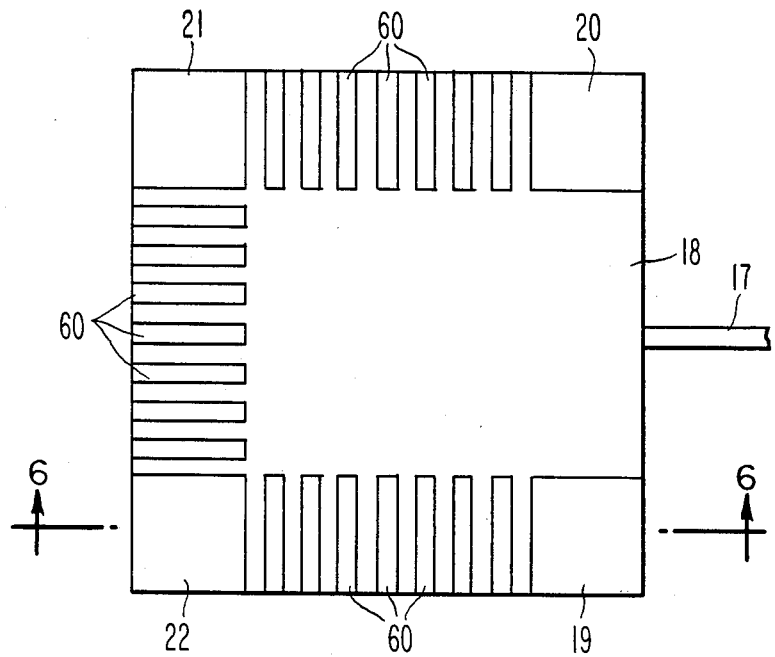
FIG. 5 illustrates a modified version of the FIG. 1 embodiment.
Figure 6:
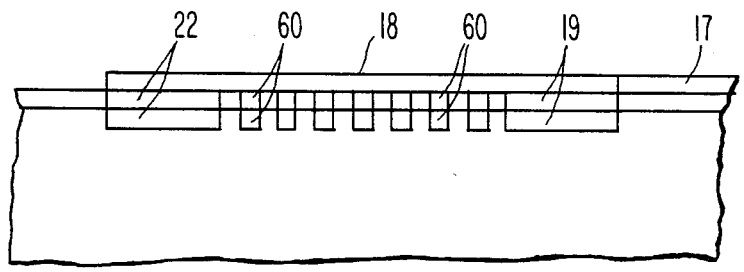
FIG. 6 is a sectional view along lines 6—6 of FIG. 5.

For example, as FIGS. 5 and 6 illustrate, several additional diodes 60 can be added between the four corner diodes 19–22 along the perimeter of pad 18. Each of these diodes 60 would be made of a P+ region 45 and N+ region 46c just like the diodes 19–22. One feature of these additional diodes 60 is that they will lower the series resistance, and increase the current capacity, over the four corner diodes 19–22. In addition, the diodes 60 will provide many sharp edges in their N+P+ junctions, such as edge 61 in FIG. 4F. This is important because breakdown tends to occur at the sharp edges 61. Providing a large number of edges lowers the current density through the edges 61 and prevents burnout of the N+P+ junction at each edge. Also, by placing the diodes 60 at the perimeter of pad 18, field oxide 48 remains under the pad's central portion. This is important because the field oxide protects the pad 18 from shorting to the underlying substrate when the pad is touched with a test probe or put under pressure during a wire bonding operation.

Also, as another modification, the makeup of logic gate 10 from which electrostatic charge is being diverted can change completely. For example, gate 10 can be any conventional logic gate which is made of PNP transistors, NMOS transistors, or CMOS transistors. In the case of PNP transistors, all N type doping in FIGS. 4A–4F would become P type, and vice versa.

As still another modification, it is to be understood that various materials can be used to make up the pads 18. Any good electrical conductor will suffice. Also, the pads 18 can have solder bumps on them which are of a type that enables the chip to be attached to another substrate and receive input signals from it without any discrete wires between the two.

Accordingly, it is to be understood that the invention is not limited to the above details but is defined by the appended claims.

What is claimed is:

1. An integrated circuit chip, having improved static discharge protection, comprising:
   a semiconductor substrate with a major surface;
   a plurality of bipolar transistors that are integrated into said surface;
   patterned conductors that interconnect said bipolar transistors and route input signals to the base of selected ones of said bipolar transistors;
   said patterned conductors including metal pads for receiving said input signals for an external source;
   wherein integrated into said surface directly beneath said metal pads are respective diodes which connect said pads to said substrate and conduct electrostatic charge therebetween.

2. An integrated circuit chip according to claim 1 wherein each of said metal pads has an acute corner, with a respective one of said diodes disposed at said corner.

3. An integrated circuit chip according to claim 1 wherein each pad has four corners of 90°, and respective diodes lie at each corner.

4. An integrated circuit chip according to claim 1 wherein a plurality of said diodes lie beneath each pad along its perimiter.

5. An integrated circuit chip according to claim 1 wherein said transistors are isolated from each other by a channel stop; and said diodes are P+N+ junctions which are patterned by two masks that also pattern said channel stop and the collector of said transistors.

6. An integrated circuit chip according to claim 1 wherein each of said pads is at least 50 μm by 50 μm, and each of said diodes is at least 10 μm by 10 μm.

7. An integrated circuit chip, having improved static discharge protection, comprising:
   a semiconductor substrate with a major surface;
   a plurality of transistors that are integrated into said surface;
   patterned conductors that interconnect said transistors and route input signals to selected ones of said transistors;
   said patterned conductors including pads for receiving said input signals for an external source;
   wherein integrated into said surface directly beneath said pads are respective diodes which connect said pads to said substrate and conduct electrostatic charge therebetween.

8. An integrated circuit chip according to claim 7 wherein said transistors are bipolar transistors.

9. An integrated circuit chip according to claim 7 wherein said transistors are NMOS transistors.

10. An integrated circuit chip according to claim 7 wherein said transistors are CMOS transistors.

11. An integrated circuit chip according to claim 7 wherein each of said pads has an acute corner with a respective one of said diodes disposed thereunder.

* * * * *